United States Patent [19]
Hartley

[11] Patent Number: 5,917,932
[45] Date of Patent: Jun. 29, 1999

[54] SYSTEM AND METHOD FOR EVALUATING IMAGE PLACEMENT ON PRE-DISTORTED MASKS

[75] Inventor: John George Hartley, Fishkill, N.Y.

[73] Assignee: International Business Machines Corporation, Armonk, N.Y.

[21] Appl. No.: 08/881,220

[22] Filed: Jun. 24, 1997

[51] Int. Cl.[6] ............................ G06K 9/00; G03F 9/00
[52] U.S. Cl. ............................ 382/144; 430/5; 430/30
[58] Field of Search ............................ 382/144, 141, 382/145, 149, 151; 430/5, 30, 22, 311; 356/237, 396

[56] References Cited

U.S. PATENT DOCUMENTS

| | | | |
|---|---|---|---|
| 4,397,543 | 8/1983 | Kolbe et al. | 355/40 |
| 4,559,603 | 12/1985 | Yoshikawa | 364/491 |
| 4,600,996 | 7/1986 | Kawauchi | 364/491 |
| 4,737,920 | 4/1988 | Ozawa | 364/490 |
| 4,814,626 | 3/1989 | Doemens et al. | 250/561 |
| 5,208,124 | 5/1993 | Sporon-Fiedler et al. | 430/5 |
| 5,270,796 | 12/1993 | Tokui | 356/394 |
| 5,308,991 | 5/1994 | Kaplan | 250/492 |
| 5,402,224 | 3/1995 | Hirukawa et al. | 356/124 |
| 5,458,998 | 10/1995 | Takekuma et al. | 430/5 |
| 5,481,624 | 1/1996 | Kamon | 382/144 |
| 5,521,036 | 5/1996 | Iwamoto et al. | 430/22 |
| 5,572,598 | 11/1996 | Wihl et al. | 382/144 |
| 5,773,180 | 6/1998 | Tomimatu | 382/144 |
| 5,781,656 | 7/1998 | Hagino et al. | 382/144 |
| 5,798,193 | 8/1998 | Pierrat et al. | 382/144 |

*Primary Examiner*—Leo H. Boudreau
*Assistant Examiner*—Bhavesh Mehta
*Attorney, Agent, or Firm*—Daryl K. Neff; Dale M. Crockatt; Graham S. Jones, II

[57] ABSTRACT

Process steps are provided to analyze image placement on a pre-distorted lithographic mask produced by a lithographic system. Obtain metrology data, form a reference array equal to the design coordinates of the metrology sites. Align the metrology data grid coordinate system to remove rigid body components from the metrology data offsets. Parse the metrology data into one or more correction areas. If the mask is to have its disposition provided according to the statistics of the residual errors in the correction areas, then compute the statistics and compare them to the specifications. Otherwise concatenate the local reference arrays summed with their corresponding correction area center coordinates to form reference mark design location arrays. Concatenate temporary arrays with the mask offsets free of pre-distortion into an array of mask offsets corresponding to desired disposition areas and compute statistical distribution of residual errors in array(s) of mask offsets for disposition. Compare statistical distribution of residual errors determined during computation with the specified statistical distribution of the mask disposition areas to accept or reject the mask.

14 Claims, 10 Drawing Sheets

SYSTEM AND METHOD FOR EVALUATING IMAGE PLACEMENT ON PRE-DISTORTED MASKS

BACKGROUND OF THE INVENTION

1. Field of the Invention

This invention generally relates to lithography tools for the manufacture of microelectronic components, and more particularly, to a method and apparatus for analyzing image placement on a pre-distorted lithographic mask.

2. Description of Related Art

U.S. Pat. No. 5,308,991 of Kaplan for "Method and Apparatus for Making a Predistorted Reticle to Compensate for Lens Distortions" describes a method of generating a global pre-distortion for a mask, but does not discuss any method of evaluating the resulting distorted mask. Kaplan provides corrections only at locations addressed by the stage and not at locations reached by summing an electromagnetic deflection to the stage position. The metrology sites used to provide for disposition of the mask will typically be at locations reachable only through combined deflection.

U.S. Pat. No. 5,481,624 of Kamon for "Mask Inspecting Method and Mask Detector" describes a method of inspecting phase shift masks. Here an optical element is introduced into the inspection tool which perceives the mask images in a fashion similar to what would be exposed on the wafer. Since the goal of any mask technology, included phase shifting is to reproduce the design CAD data, this method would allow the user to determine if a phase shift mask is working, though it does not give the user complete information regarding problems that may be detected. This method works with the generation of a pre-distorted feature shape, but not feature location, The disclosure works with pre-distorted feature locations.

U.S. Pat. No. 4,559,603 of Yoshikawa for "Apparatus for Inspecting a Circuit Pattern Drawn on a Photomask Used in Manufacturing Large Scale Integrated Circuits" describes a method of enhancing the resolution of a mask inspection device. The reference CAD data is manipulated to generate a synthetic signal that matches the expected signal from the mask. A mask that is pre-distorted by a means other than the manipulation of the CAD data could not be inspected with this system.

U.S. Pat. No. 4,600,996 of Kawauchi for "Arrangement for Inspecting Circuit Patterns Drawn on a Mask" describes a method of comparing an exposed pattern to the design CAD data as stored in an E-beam exposure tools memory. To the extent that any intended pre-distortion is residing in that location in memory, then the Kawauchi method could in principle evaluate a pre-distorted mask. The Kawauchi method will not see pre-distortion that is introduced through a different channel, such as the laser response method outlined in the Kaplan '991 patent. In that case, the method of Kawauchi patent would treat the desired pre-distortion as an error.

SUMMARY OF THE INVENTION

A problem solved by this invention is that while it is sometimes desirable to create an IC photomask that has built-in distortions to compensate for known, repeatable distortions in following processes, if these distortions are unique to a particular tool and they are applied on a field basis rather than a global basis, conventional criteria for providing disposition of this mask may give an artificially high placement error due to the pre-distortions. This invention provides a solution to that problem.

While the Kaplan '991 patent begins its method in the same manner as the present invention by collecting distortion data for the stepper optics; Kaplan then uses the collected distortion data to provide a compensating distortion to the mask making lithography tool, by modifying the response of the X-Y stage laser interferometer of the system to make the correction. The method of the present invention is an improvement because when a mask making lithography tool exposes a mask, there always exists a hierarchy of deflection systems. The X-Y stage interferometer only forms the bottom layer of this hierarchy. In a step and repeat mask-maker for example, the X-Y stage is responsible only for establishing the position of the center of the field. Magnetic and electrostatic deflection systems are responsible for positioning the exposure beam within the field. Kaplan '991 corrects only for lens distortion at the center field level. This invention provides for an additional level of correction through the computation and application of correction coefficients at the field level. This has the effect of reducing stitching errors at the field or stripe boundaries. Kaplan '991 makes suggestions regarding the correction of errors in image placement induced by wafer processing.

Relative to Kawauchi patent '996 an object of this invention is to provide a method which is independent of the stage at which the pre-distortion is introduced.

An object of this invention is to provides the ability to provide for disposition of masks that have a built-in pre-distortion that would artificially inflate the 3-sigma ($3\Sigma$) placement data using normal criteria for providing disposition.

This invention will be useful in the long-term future in the production of high quality photo and X-ray masks and to extend the life of existing steppers into future generations.

In accordance with this invention, a system and method are provided for analyzing image placement on a pre-distorted lithographic mask produced by a lithographic system comprising the following steps (which are performed by the system or in performing the method).

(a) Obtain metrology data comprised of the design coordinates of metrology sites and the offsets between the actual marks and the designed location(s) from a pre-distorted lithographic mask.

(b) Form a reference array equal to the design coordinates of the metrology sites.

(c) Align the metrology data grid coordinate system to the coordinate system of the lithography system to remove rigid body components from the metrology data offsets.

(d) Parse the metrology data out into one or more correction areas.

(i) Retrieve the limits of the current correction area from a mask data base.

(ii) Scan the metrology data to find all measured points lying within the current correction area.

(iii) Preserve pointers to the data elements and the corresponding design coordinates found in the preceding step.

(iv) Test for the case of no data found.

(v) For the case of no data, create a data element for the correction area that signals that case and create a corresponding null reference.

Otherwise for the case of data:

(vi) For each of the measured points lying within the current correction area place the corresponding design coordinates into a temporary reference array.

(vii) Copy the metrology data offsets for each point lying within the current correction area to a separate temporary array.

(viii) Adjust the reference array by subtraction of the design coordinate of the center of the correction area to form a local reference array.

(ix) Obtain distortion parameters that, were used to produce the pre-distortion in the mask correction area.

(x) Apply the pre-distortion parameters mathematically to the local reference array to obtain a set of synthetically created error vectors.

(xi) Subtract the synthetically created error vectors from the temporary array containing the measured offsets to form a temporary array containing the mask offsets free of the pre-distortion.

(e) If the mask is to have its disposition provided according to the statistics of the residual errors in the correction areas, then compute the statistics and compare them to the specifications.

Otherwise:

(f) Concatenate the local reference arrays summed with their corresponding correction area center coordinates to form one or more array(s) of reference mark design location array(s).

(g) Concatenate the temporary arrays containing the mask offsets free of pre-distortion into one or more array(s) of mask offsets corresponding to the desired disposition area(s).

(h) Compute the statistical distribution of the residual errors in the array(s) of mask offsets for providing disposition.

(i) Compare the statistical distribution of the residual errors determined in step (h) with the specified statistical distribution of the mask disposition area(s) for the purpose of accepting or (j) Store the statistical distribution of the mask offset data minus the pre-distortion;

(k) Obtain the required statistical distribution specification of the final mask;

(1) Compare the statistical distribution of the mask offset data minus the pre-distortion to the required statistical distribution specification of the final mask.

(m) Provide for disposition of the mask as accept or reject dependent upon the results of the comparison. rejecting the mask.

Preferably, after the alignment in step (d), perform the step of least squares fit analysis to check the alignment.

Preferably, the correction areas correspond to chip boundaries, field boundaries, cluster boundaries, subfield boundaries and/or stripe boundaries.

Preferably, the correction areas correspond to lithographic exposure fields.

Preferably, step (c) is performed by looking at the mask offset of a pair of alignment marks to compute a translation and rotation term which is then applied to the bulk of the data.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 5:
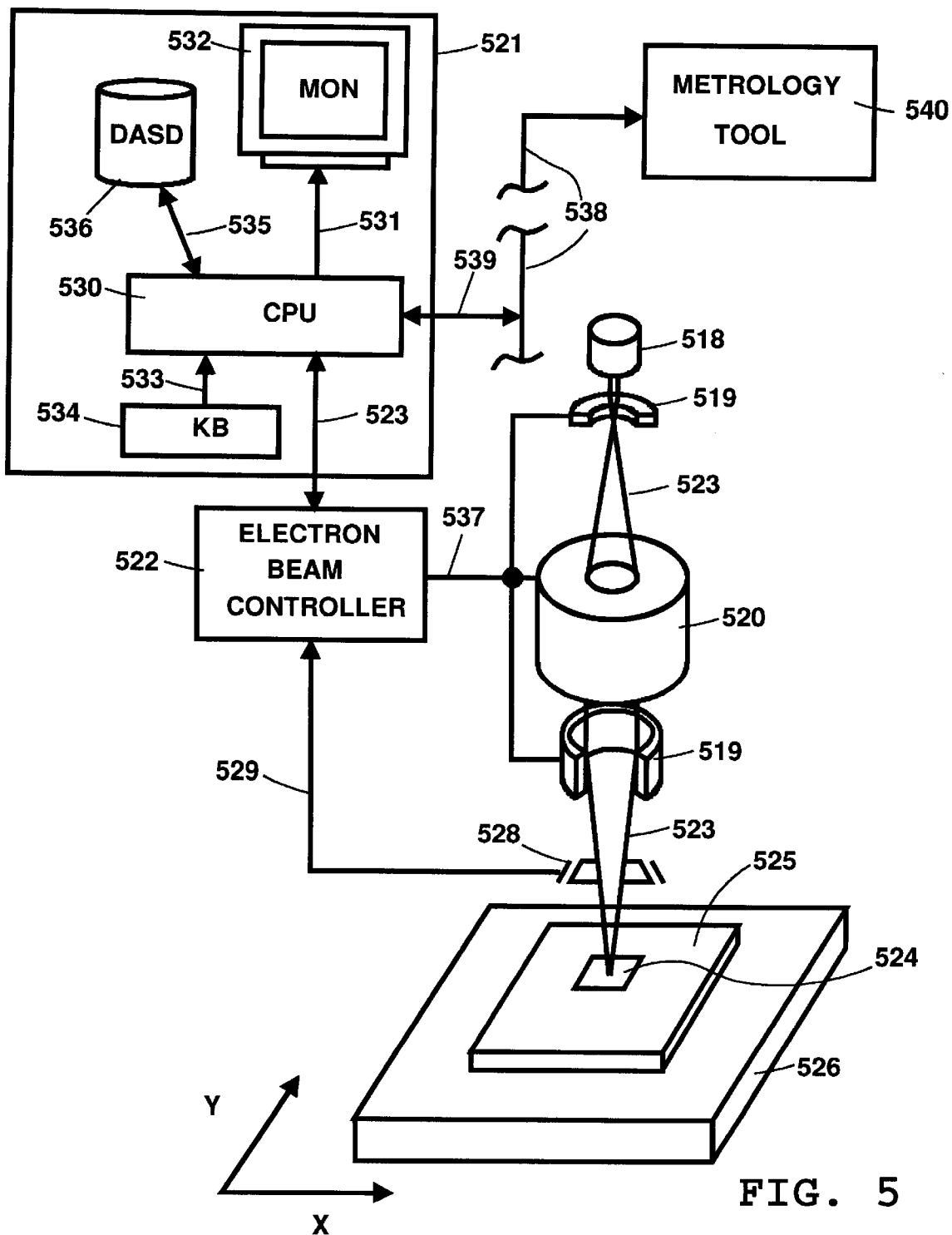
FIG. 5 shows a schematic diagram of a well known kind of electron beam apparatus and a data processing system, which are readily available in the semiconductor industry suitable for use in connection with this invention, as well as a metrology tool for use in collecting data in accordance with this invention.

FIG. 5 shows a schematic diagram of a well known kind of electron beam apparatus and a data processing system, which are readily available in the semiconductor industry, as well as a metrology tool for use in collecting data in accordance with this invention. The apparatus of FIG. 5 is suitable for use in connection with this invention. This apparatus has an electron beam source 518 which generates an electron beam (E-beam) 523 which can be deflected by the X and Y plates and coils 519 and 520. The plates and coils 519 and 520 can be readily controlled by a computer 521 through an E-beam controller 522 which is connected to controller 522 by line 527. Controller 522 is connected by lines 537 to the plates and coils 519 and 520 in the conventional manner. By controlling the plates and coils with the signals on lines 537 the beam 523 is caused to scan a limited region 524 on a workpiece 525 upon which the beam 523 is impinging. To bring new regions of the workpiece 525 under the beam 523, the workpiece 525 is generally mounted on a suitable stepping stage 526 movable along the X-Y directions indicated in the drawing.

To collect data concerning the region 524 on a workpiece 525 mounted on the stage 526, back-scattered electron detectors 528 are provided connected to via line 529 to E-beam controller 522. The E-beam exposure tool is then operated as part of an E-beam metrology tool. The mask 525 is exposed in the tool, removed and processed. It is then returned to the tool where the E-beam 523 is scanned across the metrology sites positioned under the E-beam 523 by the stage 526. The resulting back-scatter electrons measured on line 529 are processed by the E-beam controller 522. The resulting data is transferred to the CPU 530 where it is then stored in the DASD 536.

Alternatively, after mask 525 is processed, it may be measured in metrology tool 540 and the data electronically transferred via network 538 to CPU 530 where it is then stored on DASD 536.

The computer 521 includes a central processing unit (CPU) 530 connected by line 531 to supply data to a monitor 532, connected by line 533 to receive data from a keyboard 534, and connected by line 535 to send and receive data from a direct access storage device (DASD) 536 which stores the data, software and programs employed by the CPU 530 in accordance with this invention. The CPU 530 includes a random access memory (referred to hereinafter as memory) for temporary storage of data during data processing operations. The CPU 530 is also connected to a metrology tool 540 through line 539 which connects to a conventional Local Area Network (LAN) line 538 for sending and receiving data to/from the metrology tool 540.

Note that a pre-distorted lithographic mask 525 is seen in a lithography system which is the workpiece 525 being employed in accordance with this invention.

| GLOSSARY | | |
|---|---|---|
| BL(I) | = | Y coordinate of Bottom of correction region I. |
| CHIPCALC0 | = | Subroutine that removes pre-distortion. |
| CHIPCALC1(I) | = | Subroutine that removes pre-distortion from region I. |
| CONCATENATED | = | To join 2 strings of data together sequentially; to treat two sets of related data as a single unit of data for processing. |
| CORRECTION AREA | = | User specified region over which a specific set of pre-distortion is applied. |
| DATA BASE | = | Collection of data related to a subject organized so that it can be consulted. |
| DATA BASE VALUE | = | Value of specified entry in the data base. |
| DATA[I;] | = | Set of positional errors for region I. |
| DATA[L;] | = | Set of positional errors for region L. |
| DDATA | = | Location for combining correction areas into disposition areas |
| DDATA | = | DDATA CONCATENATED WITH DATA[L;] |
| DDATA 0 × 2 NULL ARRAY | = | Initialization of DDATA as 2 Column matrix with no entries. |
| DISPOSITION | = | (noun) Comparison of placement statistics of a region with the specification for that region. |
| DISPOSITION | = | (verb) To determine the selection of where an item goes for processing or is rejected; to dispose of. |
| DISPOSITION AREA | = | A mask or subset thereof for which an image placement specification is given. |
| DISPOSITION AREA I | = | A specific subset of the mask for which an image placement specification is given. |
| DL | = | General specification of metrology mask locations. |
| DL[L;1] | = | X coordinate of metrology site L. |
| DL[L;2] | = | Y coordinate of metrology site L. |
| DL[J;] | = | X,Y coordinates of metrology site J. |
| DMAP | = | X,Y coordinates of correction area centers. |
| DMAP[I;] | = | X,Y center coordinates of correction area I. |
| DMAP[I;1] | = | center X coordinates of correction area I. |
| DMAP[I;2] | = | center Y coordinates of correction area I. |
| DREF 0 × 2 NULL ARRAY | = | Initial 2 column empty matrix to hold the design coordinates of the metrology sites within a disposition region. |
| DREF | = | DREF CONCATENATED WITH FIELDREF(L;) |
| FIELDREF[I;] | = | Location of metrology marks for correction area area "I" relative to center of correction area. |
| FIELDREF[L;] | = | Location of metrology marks for correction area area "L" relative to center of correction area. |
| I | = | In CHIPCALC0 and CHIPCALC1 "I" is an index to a particular correction area/region In MASKDISP0 "I" is an index to a particular disposition area/region. |
| J | = | Pointers to data elements to Data Values of L for which TESTXY[L] is TRUE. |
| J[L] | = | {SET OF CORRECTION AREAS IN DISPOSITION AREA 1} in MASKDISP1(I) |
| K | = | Number of XY pairs in DL in CHIPCALC0 & # of correction areas in disposition area I. |
| L | = | Specific XY pair in DL CHIPCALC0(I) specific correction area in disposition area in MASKDISP1(I) |
| LL(I) | = | Left limit X value of correction area I |
| MAP | = | High level description of what is on a mask |
| MASKDISP0 | = | Main routine for disposition of pre-distorted masks. |
| MASKDISP1(I) | = | Routine which merges correction areas into |

-continued

GLOSSARY

| | | |
|---|---|---|
| MISSING_FLAG | = | disposition areas<br>Value assigned to a correction area which does not contain metrology sites. |
| N | = | Number of chip correction areas in CHIPCALC0 or number of disposition areas in MASKDISP0. |
| NULL ARRAY | = | Shape of matrix before data is inserted. |
| PDC | = | PreDistortion Coefficients. |
| Parse | = | To break data into smaller chunks so that a program can act on the data. |
| Parsing | = | Breaking a data set into smaller chunks. |
| String | = | A data structure composed of a sequence of characters representing human readable text characters. |
| PDDATA | = | The specific pre-distortion for the metrology sites. |
| PDDATA | = | F(PDC,FIELDREF[I;]) - the computed pre-distortion for correction area I. |
| Pre-distorted | = | A mask or reticle which has been designed to compensate for lens field errors by using distortion data to produce corrections for the lens field errors. |
| RL(I) | = | The right side limit (x coordinate of correction area I) |
| SIGMA | = | Standard Deviation in Statistics |
| 3 SIGMA | = | Three times the Standard Deviation |
| TDATA[J;] | = | A subset of the metrology data, contained with a correction area. |
| TL(I) | = | Top limit: Y coordinate of correction area I |
| TESTX[L] | = | Temporary Boolean vector that records A"1" if the X coordinate of metrology site lies within correction area I |
| TESTY[L] | = | Temporary Boolean vector that records A"1" if the Y coordinate of metrology site lies within correction area I |
| TESTXY[L] | = | TESTX[L] AND TESTY[L] |

When a lithographic mask is pre-distorted in order to compensate for distortion in a lithographic process flow, evaluation of the quality of image placement is a problem. The normal method of measuring the placement on the mask and comparing the resulting three sigma ($3\Sigma$) error distribution against a specification is inadequate because the presence of the pre-distortion artificially inflates the three sigma ($3\Sigma$) value. The simple case where a global array magnification is applied is handled by the generally known method of least squares fitting of the data for array magnification and comparing the resulting coefficients against the specification. The residual three sigma ($3\Sigma$) error distribution is then compared against a specification, as well. This invention deals with the more complicated case in which the pre-distortion is applied on a per-field basis.

This invention provides a method whereby a known pre-distortion may be removed from metrology data in order to permit dispositioning a mask based upon the remaining three sigma ($3\Sigma$) residual error. The method described herein is for a step-and-repeat mask maker system, but it is also readily extendable to other types of systems as well, e.g. a continuously moving stage.

The steps in this procedure are as follows:
Step 1
  Register the metrology grid with the mask maker coordinate system. This typically involves a translation correction to account for different coordinate origins between the two systems.
Step 2
  Once the coordinate references for the two systems have been registered, the residual errors comprise a least squares fit for translation and rotation to remove any rigid body components present in the metrology data.

Step 3
  The next step in the process involves parsing the metrology data out into correction areas. In the case of a step-and-repeat mask maker, these are fields. Larger units, called chips, may contain an m×n array of fields, while a mask may contain several chips. (The chips referred to above are usually a logical level of a single integrated circuit layout.) Because pattern data does not necessarily extend all the way to a chip boundary, it frequently occurs that chips overlap on the mask. In this case, the fields on the periphery of the chip overlap as well, and the effective field boundary needs to be adjusted inward to the center of the common overlap region. For all other cases, the field boundary is just determined from the center of field coordinates and the nominal field size.

Figure 10:
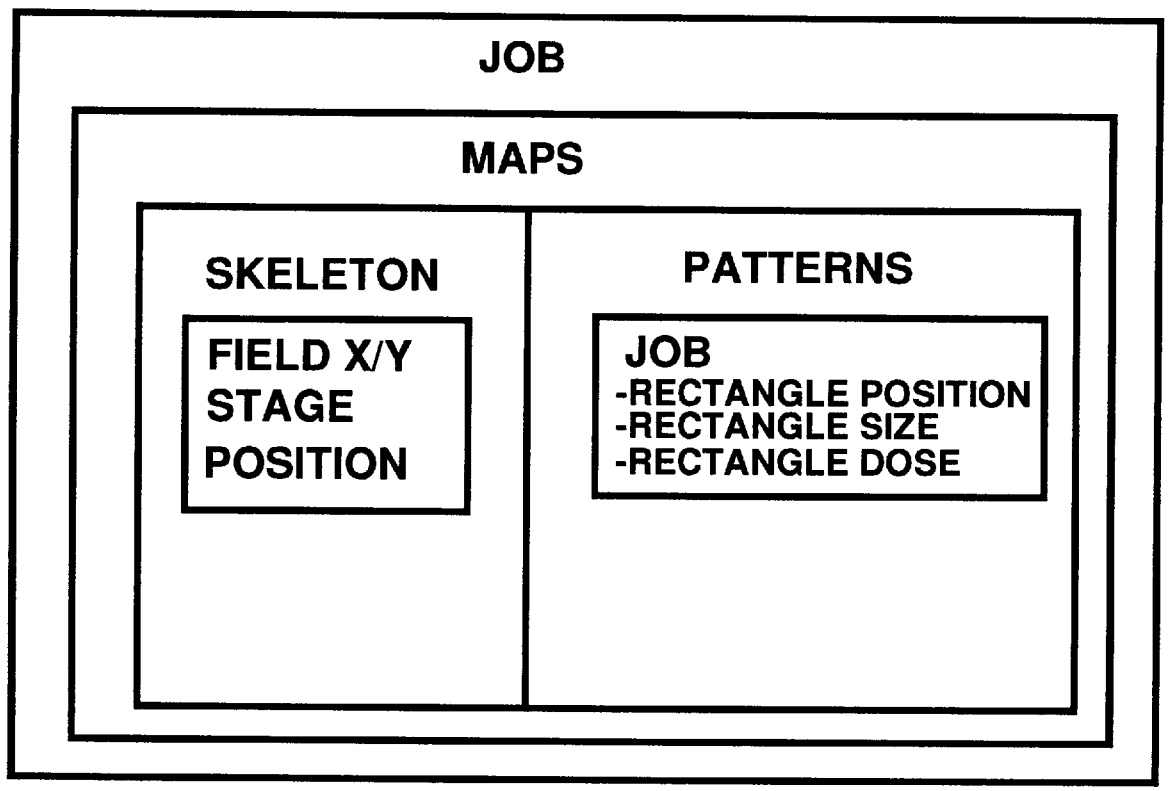
FIG. 10 shows a set substrate patterns in a way which illustrates the definitions thereof employed in connection with this invention.

FIG. 10 shows a set substrate patterns in a way which illustrates the definitions thereof employed in connection with this invention. An overall area on a mask comprises a Job. Within the job are Maps. Maps contain two parts which are a skeleton part which contains a Field X/Y, and Stage Position. The other part contains Patterns which include as follows:
  Rectangle position
  Rectangle size
  Rectangle dose
FIGS. 11A–11D show the hierarchy of portions of a mask as described in connection with this invention.

Figure 11A:
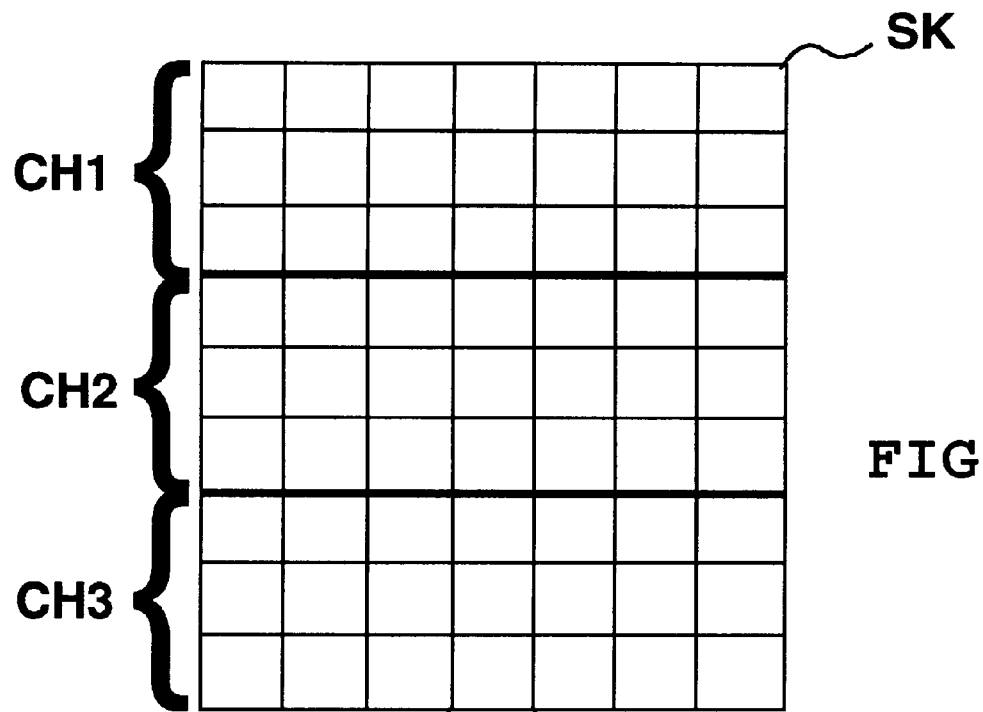
FIGS. 11A–11D show the hierarchy of portions of a mask as described in connection with this invention.

In FIG. 11A, a skeleton SK. The skeleton SK contains three chips CH1, CH2, and CH3 each containing 7 columns×3 rows of fields.

Figure 11B:
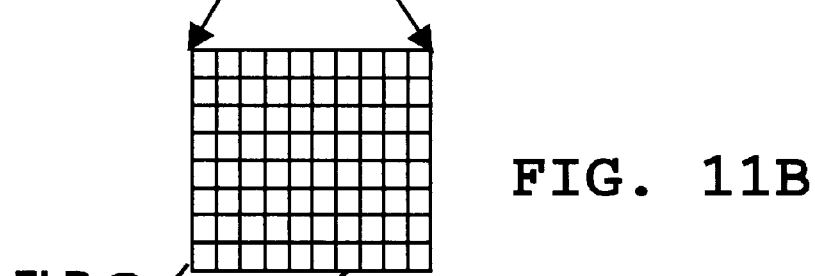

FIG. 11B shows a field FLD built up from sub-fields 10 columns by 8 rows of such subfields.

Figure 11C:
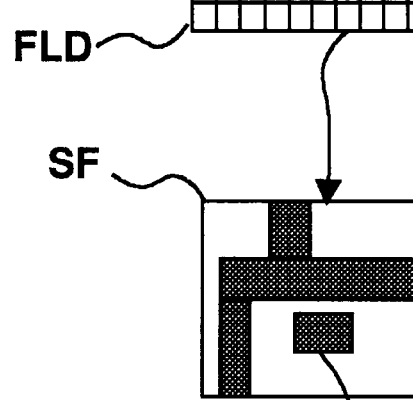

FIG. 11C shows a subfield SF containing four rectangles of various shapes as required.

Figure 11D:
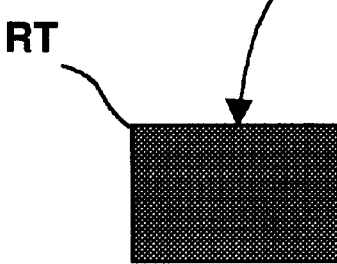

FIG. 11D shows a rectangle RT built up from small spots in a uniform array of spots.

In a step and repeat lithography system, a chip may be further divided into regions of fields, clusters and subfields (or stripes in the case of a lithography system utilizing a continuously moving stage). Corrections may be applied at each of these levels, separately, and therefore, it may be necessary to remove pre-distortions that are applied at each of these separate levels.

Step 4

Once the effective field boundaries are determined, the metrology data reference is scanned to find all measured points which lie within the current field of interest. These reference points, along with their data are copied to separate temporary arrays. The reference array is adjusted by subtraction of the field center coordinate.

Step 5

At this point, the distortion coefficients that were used to generate the initial pre-distortion are applied mathematically to the local field reference array. The result is a set of synthetically created error vectors which match the pre-distortion introduced at the time the mask was fabricated. This process is repeated for each field in the mask, and the results are reassembled into the same order as the metrology data.

Steps 1–5 need to be performed in the CPU 530 in FIG. 5 only once per mask type. The results of step 5 can then be stored in DASD 536 and used again.

To evaluate the placement of a pre-distorted mask, the results of step 5 need to be subtracted from the metrology data as it exists, only after step 2, and compared against the normal three sigma (3Σ) specification.

The flow charts of FIGS. 1, 2, 3A, 3B, and 4 describe the features of a method for analyzing image placement on a pre-distorted lithographic mask produced by a lithographic system. The steps of the method are described below with reference to the drawings.

Figure 1:
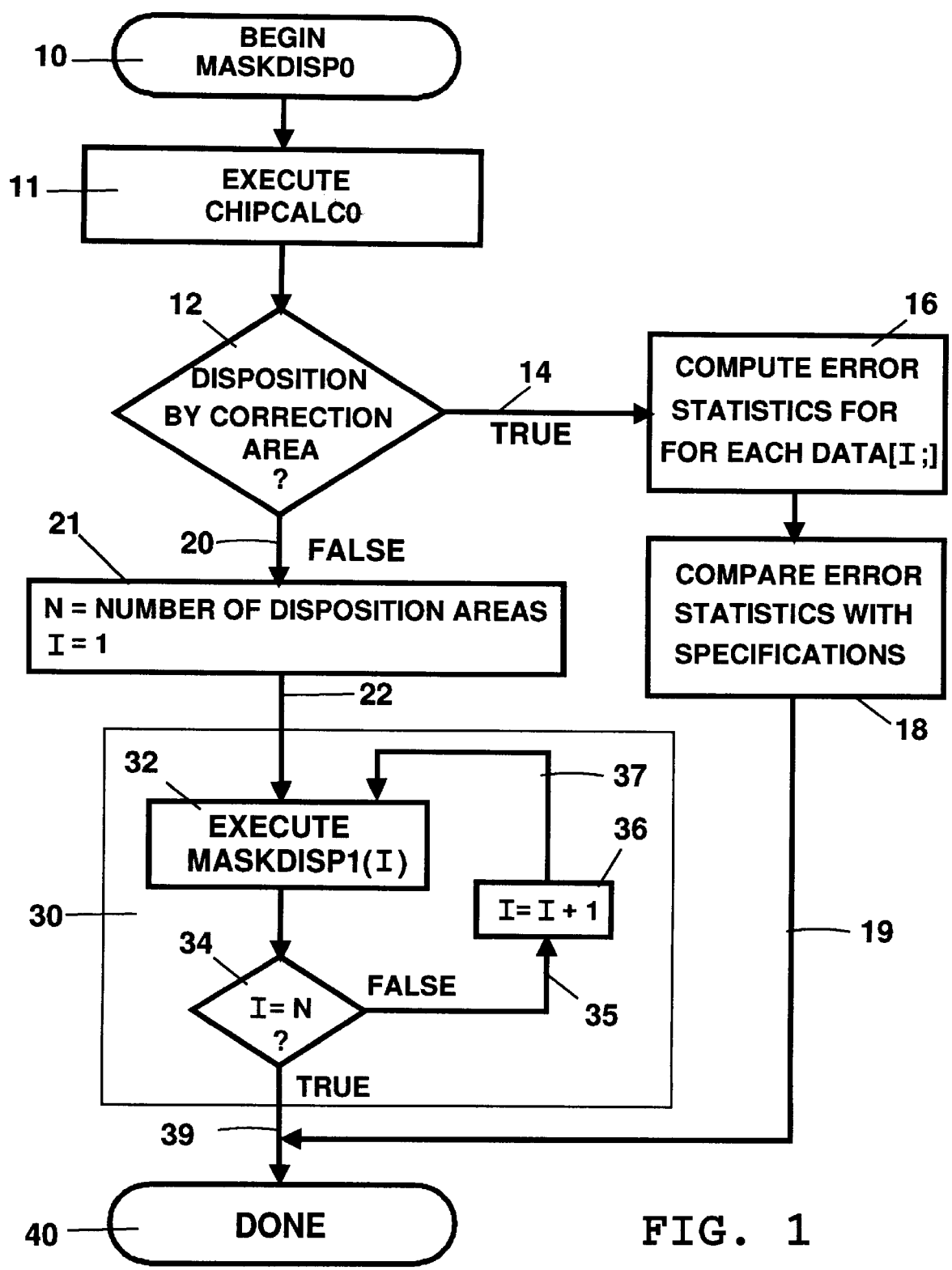
FIG. 1 shows a flowchart in accordance with the method of this invention for a program which is the main routine for the disposition of pre-distorted masks.

FIG. 1 shows a flowchart in accordance with this invention for the MASKDISP0 program which is the main routine for the disposition of pre-distorted masks. As defined above, disposition or a region on a mask involves comparison of placement statistics of a region with the specification for that region. In FIG. 1, block 10 comprises the BEGIN MASKDISP0 function wherein the MASKDISP0 routine is the main routine for disposition of pre-distorted masks. The MASKDISP0 routine is initiated in block 10 which leads to block 11 EXECUTE CHIPCALC0. In block 11, the program branches into the CHIPCALC0 subroutine (described below in detail with reference to FIG. 2) that removes pre-distortion from data for a pre-distorted mask.

After block 11, upon the completion of the CHIPCALC0 subroutine, the program returns to the test performed in block 12. In block 12, the computer 521 tests for disposition by correction area. If the answer to the test in block 12 is that it is "FALSE", then the system continues on line 20 to block 21, as described below. If the answer to the test in block 12 is that it is "TRUE", then the system branches on line 14 to block 16.

If the result of the test in block 12 is a "TRUE" result, then mask is to have its disposition provided according to the statistics of the residual errors in the correction areas and compare them to the specifications.

In block 16 the computer 521 computes the error statistics for each DATA[I;] which comprises the data for the set of positional errors for region I, where "I" is a particular disposition area on the pre-distorted mask.

Next, the program proceeds to block 18 to compare the error statistics produced as the output of block 16 with specifications block 16 with specifications stored in the DASD 536.

After block 18, the line 19 indicates that the program has been completed and thus the program leads to line 39 to block 40 indicating that the MASKDISP0 routine has been completed, i.e. DONE.

Referring again to block 12 in FIG. 1, after a FALSE answer determined by block 12, the program performs the functions starting with block 21, as follows:

The program proceeds from block 12 on line 20 to block 21 where the computer 521 sets the values of "N" and "I" as follows:

$$N = \text{NUMBER OF DISPOSITION AREAS}, \qquad (1)$$

and $$I = 1 \qquad (2)$$

Note that, in this case, "N" designates the number of disposition areas and "I" is an index to a particular disposition area since since this function is a part of MASKDISP0, according to the definition of N in the glossary above.

After block 21, the program leads via line 22 to block 30 which performs a MASKDISP1(I) routine in block 32 and an incrementing of I=I+1 in block 36 repeatedly, until I=N. The MASKDISP1(I) routine merges correction areas into disposition areas. The block 32 which performs the EXECUTE MASKDISP1(I) subroutine is described in detail below with reference to FIG. 4. Each time that the MASKDISP1(I) subroutine in FIG. 4 reaches block 416, it returns to block 34 where the test in block 34 I=N? is performed. In the event that the test in block 34 yields a result of FALSE, then the program loops back on line 35 to block 36 where the value of "I" is incremented by the integer of +1 to I+1 as follows:

$$I = I + 1 \qquad (3)$$

Then the routine loops back to repeat the block 32 once again until the test in block 34 yields a result on line 39 of TRUE.

Then line 39 leads to block 40 indicating that the routine MASKDISP0 is completed, i.e. DONE ending this main routine in accordance with this invention.

Referring again to FIG. 2, the drawing shows a flowchart for the CHIPCALC0 subroutine of block 11 in FIG. 1, which removes pre-distortion from the data stored in the DASD 536 or the memory in CPU 530. The CHIPCALC0 subroutine parses the metrology data into correction areas and removes pre-distortion therein.

In block 90, the CHIPCALC0 subroutine is begun.

Figure 2:
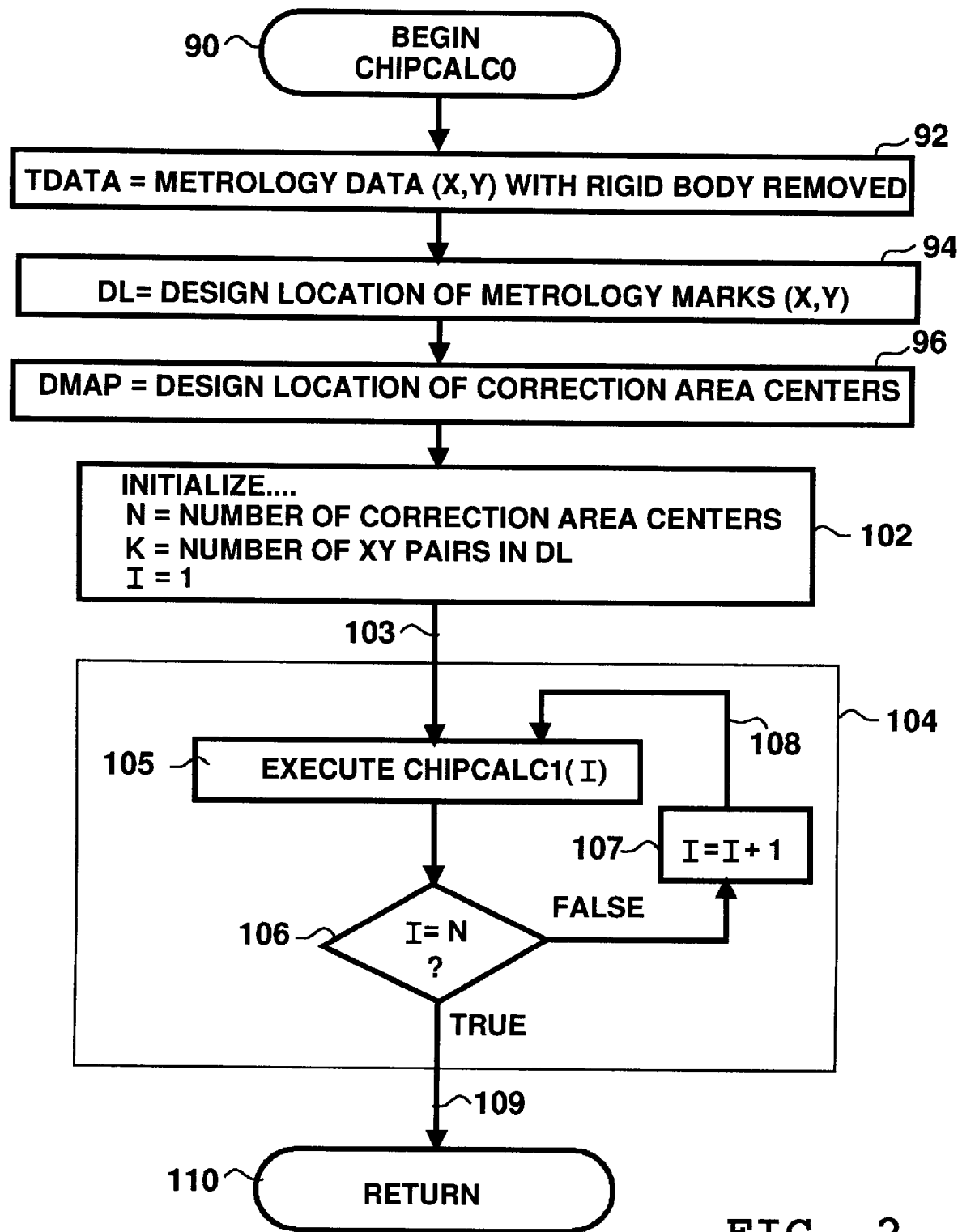
FIG. 2, shows a flowchart for a subroutine of the program of FIG. 1, which removes pre-distortion from the data stored in the a DASD or in computer memory.

In block 92 in FIG. 2, a commercial metrology system (such as a Leica LMS 2020) has been used to obtain metrology data comprised of the design coordinates of metrology sites and the offsets between the actual marks and the designed location(s) from a pre-distorted lithographic mask. The metrology data has been stored in the DASD 536 or loaded into the memory of CPU 530 for use in this step.

In blocks 92, 94, and 96 the functions which are performed therein are described next.

First of all it is necessary to obtain metrology data comprised of the design coordinates of metrology sites and the offsets between the actual marks and the designed location(s) from a pre-distorted lithographic mask.

First, in block 92 a temporary data array TDATA is formed based on the function, as follows:

TDATA=METROLOGY DATA (X,Y) WITH RIGID BODY REMOVED.

The design coordinates of the metrology sites are specified in a coordinate system which is fixed to the mask. The metrology data is specified in a coordinate system fixed relative to the X/Y stage axis of the metrology tool. In general, these two (2) coordinate systems differ by a translation and rotation, i.e. a rigid body transformation. Removing this from the metrology data creates TDATA.

Figure 9:
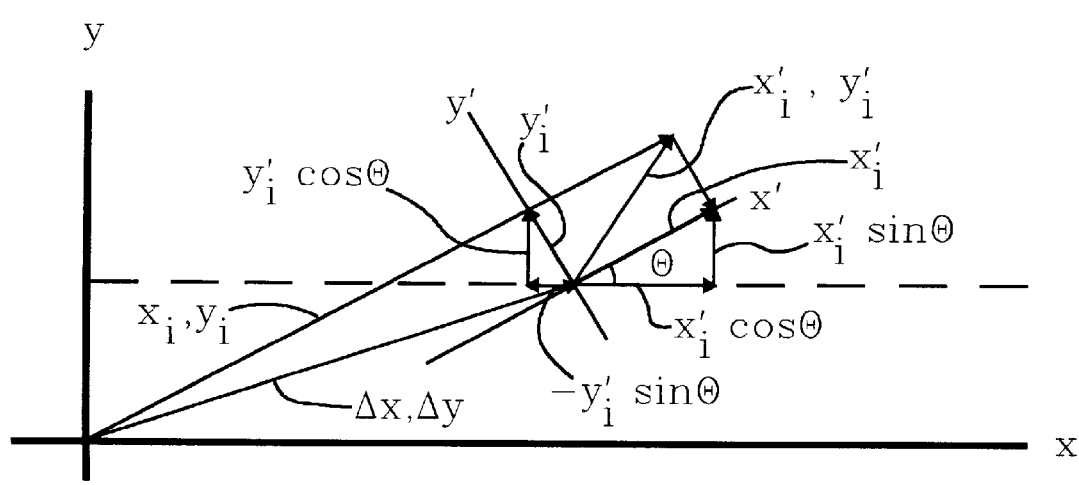
FIG. 9 shows a graph with a horizontal (x) axis and a vertical (y) axis illustrating alignment in accordance with this invention.

Referring to FIG. 9, alignment in accordance with this invention is performed as follows:

$x, y$ = mask coordinate system $x', y'$ = metrology coordinate system $x_i, y_i$ = location of mask alignment mark $i$ in mask system $x'_i, y'_i$ = location of mask alignment mark $i$ in metrology system $\Delta X, \Delta Y$ = translation coefficients $\Theta$ = rotation coefficient $$x' = \Delta X + x'_i \cos\Theta - y'_i \sin\Theta \quad (4)$$
$$y' = \Delta Y + x'_i \sin\Theta + y'_i \cos\Theta$$

Given two alignment marks 1 and 2:

$$x_1 = \Delta X + x'_1 \cos\Theta - y'_1 \sin\Theta \quad (5)$$

$$y_1 = \Delta Y + x'_1 \sin\Theta + y'_1 \cos\Theta \quad (6)$$

$$x_2 = \Delta X + x'_2 \cos\Theta - y'_2 \sin\Theta \quad (7)$$

$$y_2 = \Delta Y + x'_2 \sin\Theta + y'_2 \cos\Theta \quad (8)$$

Define:

$A = \sin\Theta$
$B = \cos\Theta$
$\delta x = x_2 - x_1$
$\delta y = y_2 - y_1$
$\delta x' = x'_2 - x'_1$
$\delta y' = y'_2 - y'_1$ Subtracting equation (7) from equation (5)

Subtracting equation (8) from equation (6)

$\delta x = \delta x' B - \delta y' A$
$\delta y = \delta x' A - \delta y' B$ which can be solved for $A$ and $B$, (only one is required)

$$B = \frac{\delta x \delta x' + \delta y \delta y'}{\delta x'^2 + \delta y'^2} = \cos\Theta \quad (9)$$

$$\Theta = \cos^{-1}\left[\frac{\delta x \delta x' + \delta y \delta y'}{\delta x'^2 + \delta y'^2}\right] \quad (10)$$

Given equation (10), equations (5) and (6) can be trivially solved for $\Delta X$ and $\Delta Y$ Equations (4) can then be applied to all of the metrology sites to transform the data from the metrology coordinate system.

The next step performed in block 94 is to form a reference array equal to the design coordinates of the metrology sites. This is equal to DL which comprises the general specification of metrology mask locations. The values of DL are found in the general specification data on metrology mask locations stored in the DASD 536.

DL=DESIGN LOCATION OF METROLOGY MARKS (X,Y):

The location of the marks X,Y was specified by the mask designer and stored in a file in the DASD 536 or the memory in CPU 530 in the conventional manner.

Figure 8:
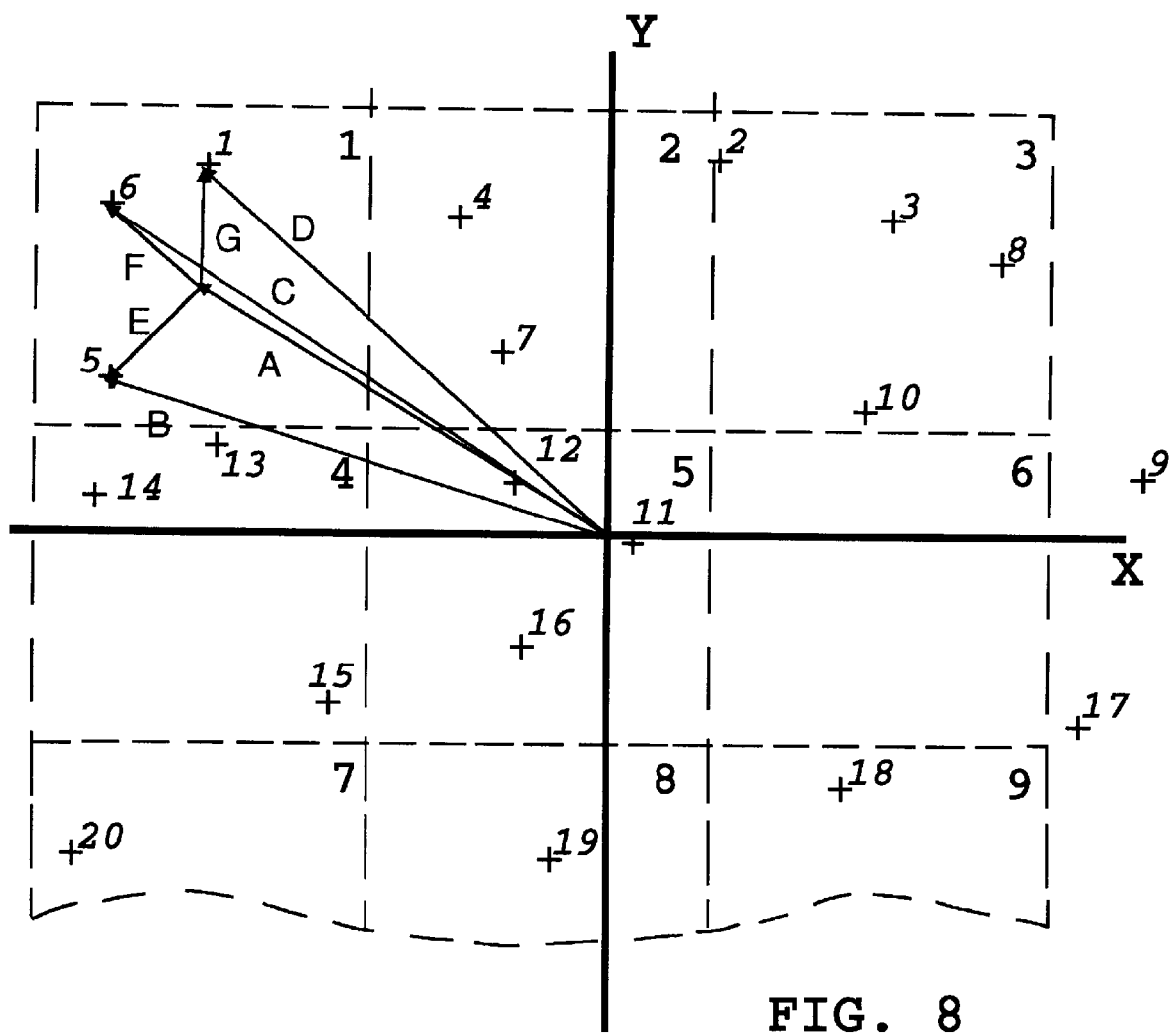
FIG. 8 shows a graph of a design location with several metrology sites K, with X, Y coordinates.

In FIG. 8, the 20 crosses shown thereby represent the design location of 20 metrology sites K. The dashed lines represent the boundaries of the correction areas, of which 9 such correction areas are presented here by way of example. The definitions are shown explicitly for correction area 1 in FIG. 8 (similar ideas pertain to the other areas) as follows:

A–DMAP[1;] The coordinates of correction area 1, relative to the mask center

B–DL[5;], The coordinates of metrology site #5, relative to the mask center

C–DL[6;], The coordinates of metrology site #6, relative to the mask center

D–DL[1;], The coordinates of metrology site #1, relative to the mask center

E=B–A, DL[5;]–DMAP[1;]=FIELDREF[1;1;],

The coordinates of metrology site #5, relative to the center of correction area 1.

F=C–A, DL[6;]–DMAP[1;]=FIELDREF[1;2;],

The coordinates of metrology site #6, relative to the center of correction area 1.

G=D–A, DL[1;]–DMAP[1;]=FIELDREF[1;3;],

The coordinates of metrology site #1, relative to the center of correction area 1.

For correction area 1, J is the set {1,6,5}
For correction area 2, J is the set {4,7}
For correction area 3, J is the set {2,3,8,10}
For correction area 4, J is the set {13,14,15}
For correction area 5, J is the set {12,11,16}
For correction area 6, J is the empty set, i.e. there are no metrology sites in this area.

The next step performed, which is performed in block 96, is as follows:

DMAP=DESIGN LOCATION OF CORRECTION AREA CENTERS

This data is map specific and is stored in the tool control data base in the DASD 536.

The step performed in block 92, in FIG. 2, is to align the metrology data grid coordinate system to the coordinate system of the lithography system to remove rigid body error components from the metrology data offsets. This can be done by looking at the mask offset of a pair of alignment marks to compute a translation and rotation term which is then applied to a the bulk of the data. The disadvantage of this technique is that any errors in the placement of the alignment marks then propagate into the data. The normal practice is to determine the translation and rotation terms by use of a least squares technique and using the translation and rotation coefficients to transform the metrology data offsets into a coordinate system where the data has no net translation or rotation.) This function, which is well understood by those skilled in the art, is described next.

Because of the arbitrary positioning of the substrate on the metrology tool stage, in addition to the intrinsic errors due to the lithography tool and process distortion, there is an additional rigid body error present. By rigid body error is meant X, Y, and theta ($\Theta$) errors or components thereof. The metrology data is optionally electronically transferred to a computer where the data manipulation is performed and the correction factors computed. The rigid body error is removed by a well known least squares method. This includes deriving a metrology data grid coordinate system from the metrology data and mapping or aligning the metrology data grid coordinate system to the coordinate system of the exposing lithography system to remove rigid body components.

In block 102 several values are initialized. The first value which is initialized is "N" which is the number of correction area centers. The "N" value is secured from the mask specific data stored in the tool data base in DASD 536. The correction centers are defined arbitrarily, but a minimum correction area is a field for step and repeat and frame for a continuously moving stage 526 upon which the workpiece 525 is supported. The second value which is initialized is "K" which is the number of XY pairs in the design location (DL). In addition, "K" comprises the number of metrology sites. The third value which is initialized is "I". "I" is set to "1" for initialization of the loop counter for block 104. Note that "I" is an index to a particular correction area.

In block 104 the step is performed of parsing the metrology data out into one or more correction areas.

Figure 3A:
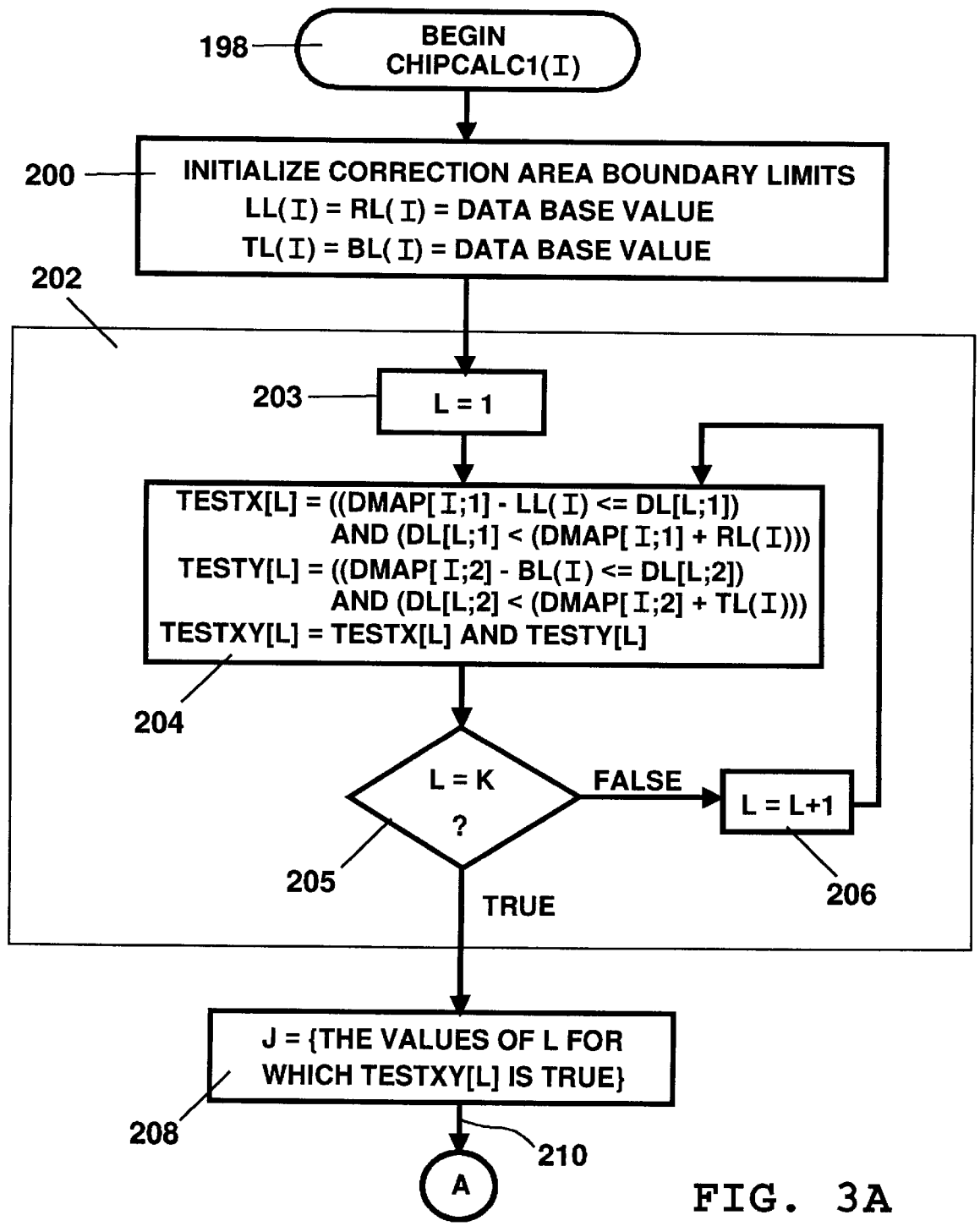
FIGS. 3A and 3B show complementary sections of the flowchart for a subroutine of FIG. 2 which removes pre-distortion from a region "I", and which parses the metrology data and reference for area "I".
Figure 3B:
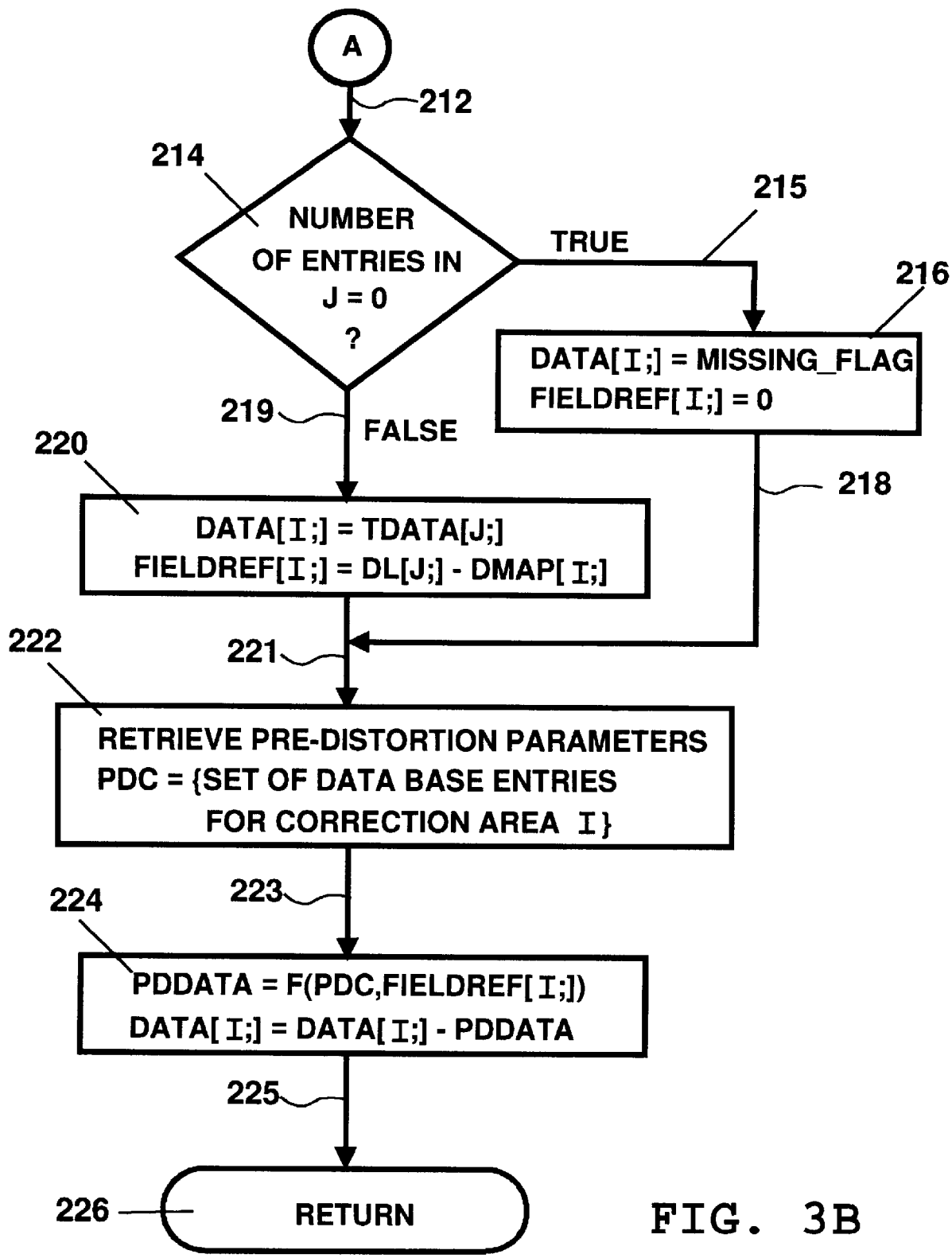

The first step in block 104 is performed by block 105 comprising the subroutine EXECUTE CHIPCALC1(I) which is shown in the flowchart of FIGS. 3A and 3B which is described in detail below. CHIPCALC1(I), which is a subroutine found in block 104 of FIG. 2, which removes pre-distortion from region "I", commences with block 198 in FIG. 3A. The CHIPCALC1(I) subroutine parses the metrology data and reference for area "I" as shown in FIGS. 3A and 3B and as described below. In other words, as stated in the glossary above, CHIPCALC1(I) is the subroutine that removes pre-distortion from region "I". After performing the CHIPCALC1(I) subroutine in block 226 in FIG. 3B, the program returns to block 106 in FIG. 2

In decision block 106, the CPU 530 (FIG. 5) tests to determine whether I=N? Note that "N" equals the number of chip correction areas (see "N" in the glossary above.)

If the answer to the test in block 106 is "FALSE" in that I≠N then the program proceeds to block 107 where the the value of "I" is incremented by the integer +1, as follows:

$$I=I+1 \tag{11}$$

Then, after block 107, the program loops back to block 105 to repeat the CHIPCALC1(I) parsing function repeatedly, until test block 106 yields a "True" result.

Assuming that computer 530 finds that I=N, i.e. a "TRUE" answer then the program proceeds along line 109 to block 110 where it is indicated that the CHIPCALC0 subroutine of FIG. 2 returns to block 12 in FIG. 1 for completing the routine described above in connection with FIG. 1.

FIGS. 3A and 3B show the flowchart for the CHIPCALC1 (I) subroutine (referred to above in block 105 in FIG. 2.) The CHIPCALC1(I) subroutine, which removes pre-distortion from region "I", starts with block 198 which starts the CHIPCALC1(I) subroutine.

Figure 6:
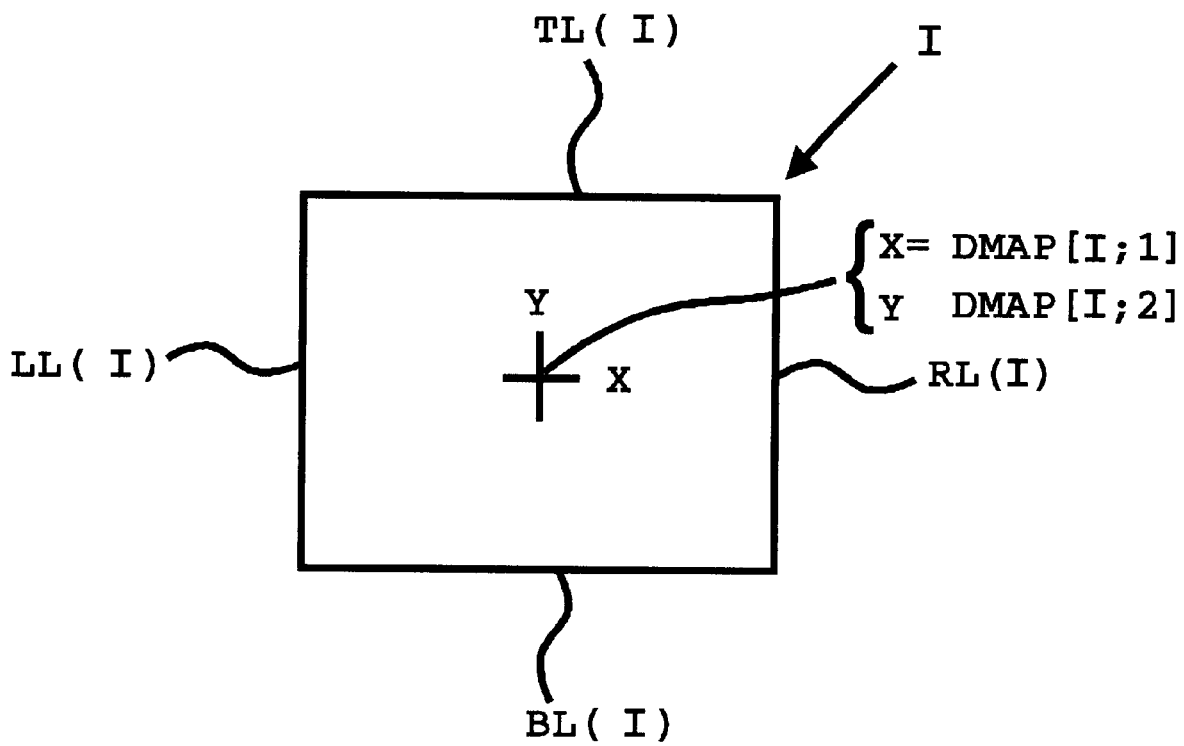
FIG. 6 illustrates a plan view with a horizontal (x) axis and a vertical (y) axis of the current correction area region "I" of a mask data base with correction area boundary limits which are initialized.

In block 200 the system retrieves data defining the limits of the current correction area (region I) from a mask data base. Region "I" is illustrated in FIG. 6. In block 200 the system performs the steps as follows:

The correction area boundary limits are initialized.

$$LL(I)=RL(I)=\text{DATA BASE VALUE} \tag{12}$$

The left limit X value LL(I) and right limit X value RL(I) of the correction area are the X coordinates in FIG. 6 for the left and right X limit values for correction area "I".

$$TL(I)=BL(I)=\text{DATA BASE VALUE} \tag{13}$$

The top limit Y value TL(I) and bottom limit Y value BL(I) of the correction area are the Y coordinates in FIG. 6 for the top and bottom Y limit values for correction area "I".

Next, referring to block 202 which contains several blocks, the system scans the metrology data to find all measured points lying within the current correction area, as follows:

First, in block 203, the systems sets the value of L, which is the specific XY pair in the mask location L as:

$$L=1. \tag{14}$$

Next, the subroutine moves to block 204 of FIG. 3A, wherein computer 521 (FIG. 5) performs the step of testing to determine whether the metrology sites fall between the left (L) and right (R) limits (L) of the area "I" which are the values defined by LL(I) & RL(I) respectively. The program in block 204 first performs the step as follows:

$$TESTX[L]=((DMAP[I;1]-LL(I)<=DL[L;1]) \text{ AND } (DL[L;1] <(DMAP[I;1]+RL(I)))) \tag{15}$$

where the parameters are as follows:

DMAP[I;1]=center X coordinates of correction area I,

DMAP[I;2]=center Y coordinates of correction area I,

DL[L;1]=X coordinate of metrology site L,

TESTX[L]=Temporary Boolean vector that records A"1" if the X coordinate of metrology site lies within correction area I, Then the program in block 204 performs the step of testing to determine whether the metrology sites fall between the top and bottom limits of the area "I" which are the values defined by BL(I) & TL(I) respectively. The program in block 204 then performs the step as follows:

$$TESTY[L]=((DMAP[I;2]-BL(I)<=DL[L;2]) \text{ AND } (DL[L;2] <(DMAP[I;2]+TL(I)))) \tag{16}$$

where

DL[L;2]=Y coordinate of metrology site L.

TESTY[L]=Temporary Boolean vector that records A"1" if the Y coordinate of metrology site lies within correction area I, Then the program in block 204 performs the third step of giving the metrology sites that are both within the top/bottom and right/left limits of the sites, as follows:

$$TESTXY[L]=TESTX[L] \text{ AND } TESTY[L] \tag{17}$$

In block 205, a test is made to determine whether L=K? If the answer is "FALSE" in that L≠K then the program proceeds to block 206, where the function of incrementing the value of L by the integer "1" is performed as follows:

$$L=L+1 \tag{18}$$

Then the program loops back to block 204 and the functions of blocks 204 and 205 are repeated until the test in block 205 produces a positive "true" result leading to block 208.

Assuming that the test in block 205 produces the answer that L=K, i.e. a "TRUE" answer then the program proceeds to Block 208 which performs the function of defining values of J to preserve pointers to data elements to Data Values of L for which TESTXY[L] is true and to preserve the corresponding design coordinates found in the preceding step in block 204. The step in block 208 is performed in accordance with the function as follows:

$$J=\{\text{THE VALUES OF L FOR WHICH TESTXY[L] IS TRUE}\} \tag{19}$$

Figure 7:
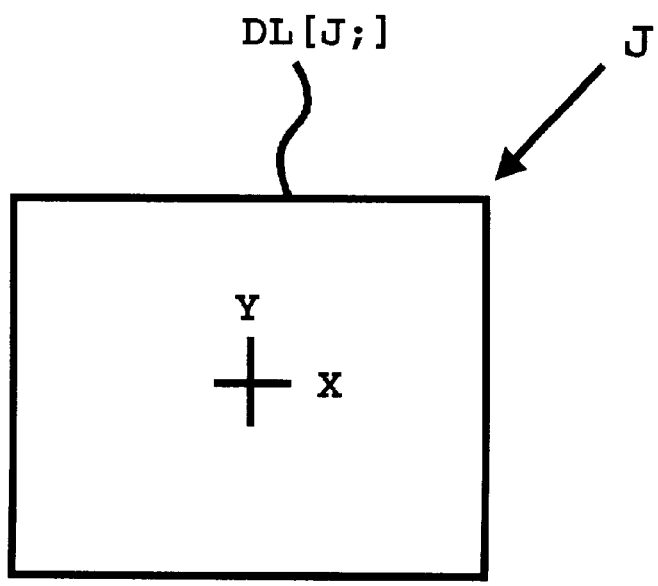
FIG. 7 illustrates a plan view of a design location of metrology site J, with X, Y coordinates.

FIG. 7 illustrates a plan view of a design location of metrology site J with X, Y coordinates.

The definitions in FIG. 8 and the definitions (for the lines seen in FIG. 8) A–G in the text above pertaining to correction area 1 in FIG. 8 are examples of this.

Line 210 leads to connector A to line 212 in FIG. 3B where the CHIPCALC1(I) subroutine continues as follows:

testing for the case of no data found;

In Block 214, a test is made to determine whether the number of entries in J equals zero as follows:

$$\text{NUMBER OF ENTRIES IN J=0?} \tag{20}$$

If the result of the test in block 214 is TRUE that the size of J=0, then the program proceeds via line 215 to block 216.

In block 216, the system reacts to the "TRUE" condition by creating a data element for the correction area that signals the fact that case exists by creating a corresponding null, i.e. "0", reference. Block 216 deals with the case of no metrology data in a correction area and in block 216 computer 521 performs the function of setting the null reference defined in the equation as follows:

$$\text{DATA[I;]=MISSING\_FLAG; FIELDREF[I;]=0,} \tag{21}$$

where the value MISSING_FLAG is a value assigned to a correction area which does not contain any metrology sites, DATA[I;] is discussed in connection with block 16 in FIG. 1 and FIELDREF[I;] is the location of the metrology mask "I" relative to the center of the correction area. Since correction areas may exist which have no metrology sites, the above step provides a place holder in the memory in CPU 530 or in DASD 536 for such areas.

Next, after block 216, the program proceeds along line 218 to line 221 to block 222, the function of which will be discussed below.

Returning to block 214, if the answer in the test 214 above is "FALSE" in that J≠0 then the program proceeds along line 219 to block 220.

The first step in block 220 is to copy the metrology data offsets for each point lying within the current correction area to a separate temporary reference array TDATA[J;] in memory in CPU 530. That is to say, a set of elements J in TDATA which are contained in the correction area I, are copied into the matrix TDATA[J;] which associates the elements with the index "I".

The first function in block 220 is performed in accordance with the function as follows:

$$\text{DATA[I;]=TDATA[J;]} \tag{22}$$

where:

DATA[I;]=Set of positional errors for region I.

TDATA[J;]=A subset of the metrology data defined in block 92 (FIG. 2), contained in region I.

The second function in block 220 in FIG. 3B is as follows:

$$\text{FIELDREF[}I;\text{]=}DL[J;\text{]-}DMAP[I;\text{]} \tag{23}$$

where:

FIELDREF[I;]=Location of metrology marks for correction area "I" relative to the center of the correction area "I".

DL[J;]=X,Y coordinates of metrology sites J, as shown in FIG. 8, and

DMAP[I;]=X,Y center coordinates of correction area I, as shown in FIG. 8 by vector A.

The function in equation (23) is similar to the above, except that the values being manipulated are the metrology site coordinates and they are being transformed to a basis with an origin at the center of the correction area. Thus, for each of the measured points lying within the current correction area, the computer 521 places the corresponding design coordinates into a temporary reference array FIELDREF[I;].

In this step, in equation (23) an adjustment is made to the reference array DL[J;] by subtraction therefrom of DMAP [I;] which is the design coordinate of the center of the correction area to form a local reference array.

Next, the program proceeds along line 221 from either block 220 or block 216 to block 222.

In block 222, the program in computer 521 obtains distortion parameters that, were used to produce the pre-distortion in the mask correction area. The function of block 222 is to perform the function of "RETRIEVE PRE-DISTORTION PARAMETERS." The pre-distortion parameters which were entered into the tool data base in DASD 536 in the computer 521 by the mask user, in general, although other sources of a tool data base can be employed. After the computer 521 in FIG. 5 retrieves the pre-distortion parameters from the DASD 536 in the computer 521 in FIG. 5, as well, as indicated by the function as follows:

$$\text{PDC=\{SET OF DATA BASE ENTRIES FOR SITE I\}} \tag{24}$$

where PDC are the PreDistortion Coefficients with one set for each correction area.

Next, the CHIPCALC1(I) subroutine proceeds from block 222 along line 223 to block 224.

In block 224, the subroutine applies the pre-distortion parameters PDC mathematically to the local reference array to obtain a set of synthetically created error vectors as follows:

$$\text{PDDATA=F(PDC,FIELDREF[I;])} \tag{25}$$

For area "I", the function F and the coefficients of PDC describe the pre-distortion parameters requested by the customer. Particular pre-distortion values are being computed by the computer 521 at the locations specified in FIELDREF[I;], which as stated above gives the location of metrology marks relative to the center of the correction area "I". Note that in the definitions in the Glossary above PDDATA is defined alternatively as follows:

PDDATA=The specific pre-distortion for the metrology sites.

PDDATA=F(PDC,FIELDREF[I;])—the computed pre-distortion for correction area "I".

The next step in block 224 follows.

In the next step, the subroutine subtracts the synthetically created error vectors PDDATA from the temporary array DATA[I;].

Referring to FIG. 8, TDATA comprises the errors associated with each of the twenty metrology sites shown in the drawing. For each I, J is a function of I so TDATA[J;] is really TDATA[J(I);], so in the example, for I=I, J={1,6,5} (For correction area 1, J is the set {1,6,5} DATA[I;] is a subset of TDATA.

For example, $$DATA[I;] = \begin{bmatrix} TDATA[1;] \\ TDATA[6;] \\ TDATA[5;] \end{bmatrix} \tag{26}$$

These contain the measured offsets to form a temporary array DATA[I;] containing the mask offsets free of the pre-distortion. (Note that the function F in box 224 is dependent upon both the lithography tool and the nature of the distortion being compensated. It is typically a polynomial of some finite order.)

The subroutine proceeds as follows:

$$\text{DATA[}I;\text{]=DATA[}I;\text{]-}PDDATA \tag{27}$$

where the expected pre-distortion PDDATA is being subtracted from the measured errors DATA[I;].

Next, the CHIPCALC1(I) subroutine proceeds from block 224 along line 225 to "RETURN" block 226 which returns the program to block 106 in FIG. 2 ending the CHIPCALC1(I) program of block 105 and proceeding into test block 106, as described above in connection with FIG. 2.

Figure 4:
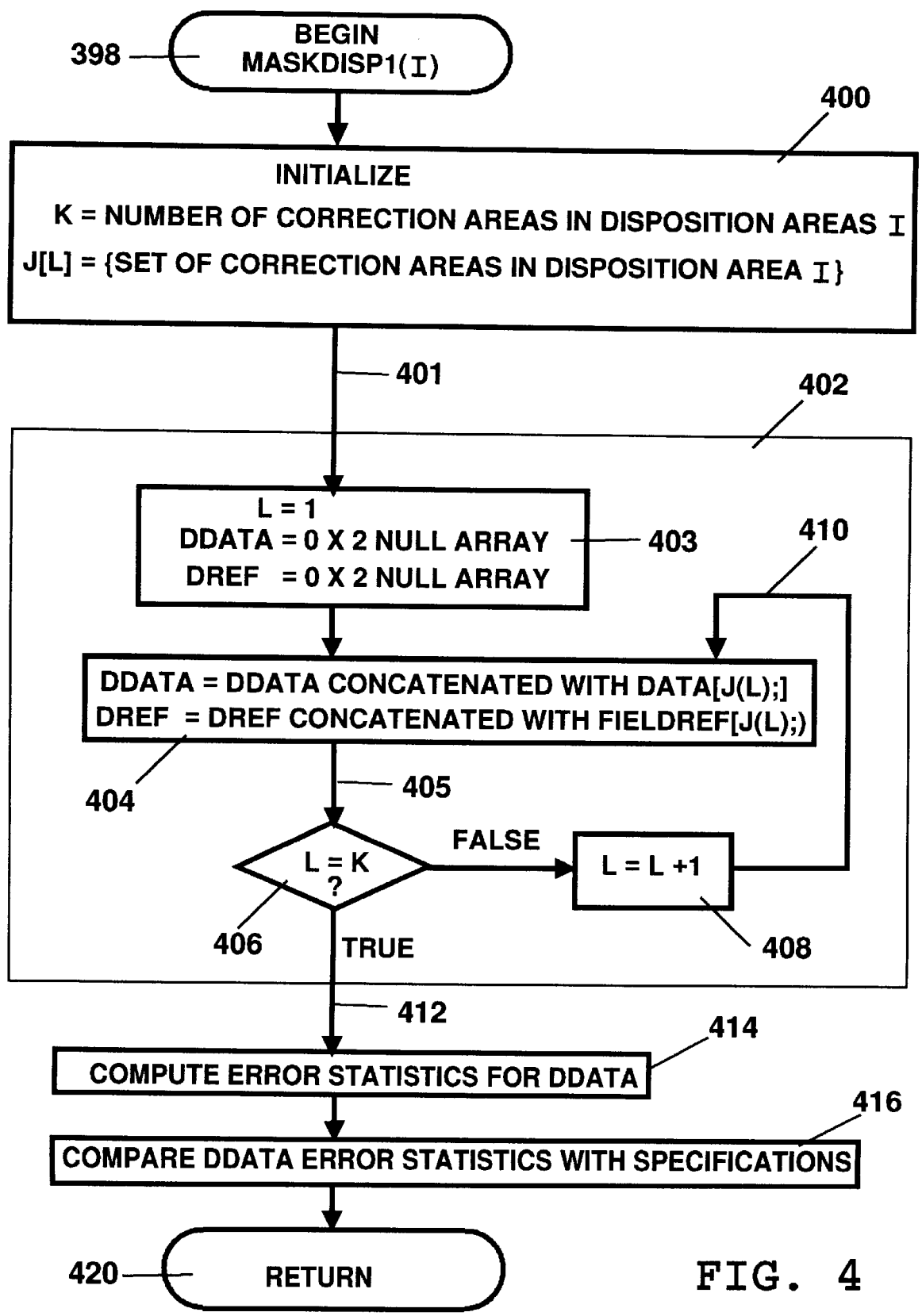
FIG. 4 shows a flowchart of another subroutine of the program which performs the subroutine of FIG. 1 which merges correction areas into disposition areas.

Referring to FIG. 4 the program performs the MASKDISP1(I) subroutine 32 in FIG. 1 as follows:

Block 398 Begin MASKDISP1(I) Block 400 INITIALIZE K=NUMBER OF CORRECTION AREAS IN IN DISPOSITION AREAS I (28)

J[L]={SET OF L CORRECTION AREAS IN DISPOSITION AREA I} (29)

where Disposition Area I is defined as a set of one or more correction areas dispositioned with a single specification.

J[L] is defined as user defined relationship between correction areas and disposition areas.

Next, in block 402 a number of functions are performed in blocks 403, 404, 406, and 408 with the result leading by line 412 to block 414.

The first step in block 402 is the setting of values for L, DDATA AND DREF.

The value of L is set to the integer 1 for the specific correction area in the disposition area in the MASKDISP1(I) subroutine being performed herein.

Next, the value of DDATA is set to be equal to a 0×2 null array as follows:

DDATA=0×2 NULL ARRAY (30)

where

DDATA is the location for combining correction areas into disposition areas.

0×2 NULL ARRAY is a two (2) column array with no entries which is located in the CPU 530 of FIG. 5.

The value of DREF is set to be equal to a 0×2 null array also, as follows:

DREF=0×2 NULL ARRAY (31)

where DREF is the location for combining correction area references into a disposition area reference.

0×2 NULL ARRAY is a two (2) column array with no entries which is located in the CPU 530 of FIG. 5.

Concatenation of local reference arrays & temporary arrays

In block 404 a first function is performed, as follows:

DDATA=DDATA CONCATENATED WITH DATA [J(L);] (32)

where DATA [J(L);] is given by equation (27) with I replaced by J(L).

The second function which is performed in block 404 is as follows:

DREF=DREF CONCATENATED WITH FIELDREF(L;) (33)

where FIELDREF[J(L;)] is given by equation (23) with "I" replaced by J(L).

After the functions in block 404 are completed, the subroutine proceeds to block 406 where the test is made as follows:

Test L=K? (34)

If the result of the test in equation (33) is "TRUE" then the subroutine goes on to block 414.

If the result of the test in equation (33) is "FALSE" then the subroutine goes on to block 408.

SET L=L+1 and then loop back along line 410 to block 404.

In flowchart block 414, the MASKDISP1(I) subroutine computes the statistical distribution of the residual errors in the array(s) of mask offsets for providing disposition, as follows:

COMPUTE ERROR STATISTICS FOR DDATA

In flowchart block 416 the MASKDISP1(I) subroutine compares the statistical distribution of the residual errors determined previously with the specified statistical distribution of the mask disposition area(s) for the purpose of accepting or rejecting the mask as follows:

COMPARE DDATA ERROR STATISTICS WITH SPECIFICATIONS.

In block 420 the MASKDISP1(I) subroutine return to block 34 in FIG. 1.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method for analyzing image placement on a pre-distorted lithographic mask produced by a lithographic system comprising the steps of as follows:

(a) obtain metrology data from a pre-distorted lithographic mask, (b) form a reference array equal to the design coordinates of the metrology sites, (c) align the metrology data grid coordinate system to the coordinate system of the lithography system, (d) parse the metrology data out into one or more correction areas, and (e) if the mask is to have its disposition provided according to the statistics of the residual errors in the correction areas,
   then compute the statistics and compare them to the specifications,
   otherwise;

(f) concatenate the local reference arrays summed with their corresponding correction area center coordinates to form one or more array(s) of reference mark design location array(s), (g) concatenate the temporary arrays containing the mask offsets free of pre-distortion into one or more array(s) of mask offsets corresponding to the desired disposition area(s), (h) compute the statistical distribution of the residual errors in the array(s) of mask offsets for providing disposition, and (i) compare the statistical distribution of the residual errors determined in step (h) with the specified statistical distribution of the mask disposition area(s) for the purpose of accepting or rejecting the mask.

2. A method for analyzing image placement on a pre-distorted lithographic mask produced by a lithographic system comprising the steps of as follows:

(a) obtaining metrology data comprised of the design coordinates of metrology sites and the offsets between the actual marks and the designed location(s) from a pre-distorted lithographic mask, (b) form a reference array equal to the design coordinates of the metrology sites,
(c) align the metrology data grid coordinate system to the coordinate system of the lithography system to remove rigid body components from the metrology data offsets,
(d) parse the metrology data out into one or more correction areas, and
  (i) retrieve the limits of the current correction area from a mask data base,
  (ii) scan the metrology data to find all measured points lying within the current correction area,
  (iii) preserve pointers to the data elements and the corresponding design coordinates found in the preceding step,
  (iv) test for the case of no data found,
  (v) for the case of no data, creating a data element for the correction area that signals that case and creating a corresponding null reference, otherwise for the case of data,
  (vi) place the corresponding design coordinates into a temporary reference array for each of the measured points lying within the current correction area,
  (vii) copy the metrology data offsets for each point lying within the current correction area to a separate temporary array,
  (viii) adjust the reference array by subtraction of the design coordinate of the center of the correction area to form a local reference array,
  (ix) obtain distortion parameters that, were used to produce the pre-distortion in the mask correction area,
  (x) apply the pre-distortion parameters to the local reference array mathematically to obtain a set of synthetically created error vectors,
  (xi) subtract the synthetically created error vectors from the temporary array containing the measured offsets to form a temporary array containing the mask offsets free of the pre-distortion,
(e) if the mask is to have its disposition provided according to the statistics of the residual errors in the correction areas
  then compute the statistics and compare them to the specifications,
otherwise;
(f) concatenate the local reference arrays summed with their corresponding correction area center coordinates to form one or more array(s) of reference mark design location array(s),
(g) concatenate the temporary arrays containing the mask offsets free of pre-distortion into one or more array(s) of mask offsets corresponding to the desired disposition area(s),
(h) compute the statistical distribution of the residual errors in the array(s) of mask offsets for providing disposition,
(i) compare the statistical distribution of the residual errors determined in step (h) with the specified statistical distribution of the mask disposition area(s) for the purpose of accepting or rejecting the mask.

3. The method of claim 2 further comprising:
after the alignment in step (d), the step of performing a least squares fit analysis to check the alignment.

4. The method of claim 2 wherein the correction areas correspond to chip boundaries, field boundaries, cluster boundaries, subfield boundaries and/or stripe boundaries.

5. The method of claim 2 wherein the correction areas correspond to lithographic exposure fields.

6. The method of claim 2 further comprising the steps of
(j) storing the statistical distribution of the mask offset data minus the pre-distortion;
(k) obtaining the required statistical distribution specification of the final mask;
(l) comparing the statistical distribution of the mask offset data minus the pre-distortion to the required statistical distribution specification of the final mask; and
(m) providing for disposition of the mask as accept or reject dependent upon the results of the comparison.

7. The method of claim 2 wherein step (c) is performed by looking at the mask offset of a pair of alignment marks to compute a translation and rotation term which is then applied to the bulk of the data.

8. A system for analyzing image placement on a pre-distorted lithographic mask produced by a lithographic system comprising:
(a) means for obtaining metrology data from a pre-distorted lithographic mask,
(b) means for forming a reference array equal to the design coordinates of the metrology sites,
(c) means for aligning the metrology data grid coordinate system to the coordinate system of the lithography system,
(d) means for parsing the metrology data out into one or more correction areas, and
(e) if the mask is to have its disposition provided according to the statistics of the residual errors in the correction areas,
  then means for computing the statistics and comparing them to the specifications,
otherwise;
(f) means for concatenating the local reference arrays summed with their corresponding correction area center coordinates to form one or more array(s) of reference mark design location array(s),
(g) means for concatenating the temporary arrays containing the mask offsets free of pre-distortion into one or more array(s) of mask offsets corresponding to the desired disposition area(s),
(h) means for computing the statistical distribution of the residual errors in the array(s) of mask offsets for providing disposition, and
(i) means for comparing the statistical distribution of the residual errors determined in step (h) with the specified statistical distribution of the mask disposition area(s) for the purpose of accepting or rejecting the mask.

9. A system for analyzing image placement on a pre-distorted lithographic mask produced by a lithographic system comprising:
(a) means for obtaining metrology data comprised of the design coordinates of metrology sites and the offsets between the actual marks and the designed location(s) from a pre-distorted lithographic mask,
(b) means for forming a reference array equal to the design coordinates of the metrology sites,
(c) means for aligning the metrology data grid coordinate system to the coordinate system of the lithography system to remove rigid body components from the metrology data offsets,
(d) means for parsing the metrology data out into one or more correction areas, and
  (i) means for retrieving the limits of the current correction area from a mask data base, (ii) means for scanning the metrology data to find all measured points lying within the current correction area, (iii) means for preserving pointers to the data elements and the corresponding design coordinates found in the preceding step, (iv) means for testing for the case of no data found, (v) for the case of no data, means for creating a data element for the correction area that signals that case and create a corresponding null reference, otherwise for the case of data, (vi) means for placing the corresponding design coordinates into a temporary reference array for each of the measured points lying within the current correction area, (vii) means for copying the metrology data offsets for each point lying within the current correction area to a separate temporary array, (viii) means for adjusting the reference array by subtraction of the design coordinate of the center of the correction area to form a local reference array, (ix) means for obtaining distortion parameters that, were used to produce the pre-distortion in the mask correction area, (x) means for mathematically applying the pre-distortion parameters to the local reference array to obtain a set of synthetically created error vectors, (xi) means for subtracting the synthetically created error vectors from the temporary array containing the measured offsets to form a temporary array containing the mask offsets free of the pre-distortion, (e) if the mask is to have its disposition provided according to the statistics of the residual errors in the correction areas, then means for computing the statistics and comparing them to the specifications, otherwise;

(f) means for concatenating the local reference arrays summed with their corresponding correction area center coordinates to form one or more array(s) of reference mark design location array(s), (g) means for concatenating the temporary arrays containing the mask offsets free of pre-distortion into one or more array(s) of mask offsets corresponding to the desired disposition area(s), (h) means for computation of the statistical distribution of the residual errors in the array(s) of mask offsets for providing disposition, (i) means for comparing the statistical distribution of the residual errors determined in step (h) with the specified statistical distribution of the mask disposition area(s) for the purpose of accepting or rejecting the mask.

10. The system of claim 9 further comprising, after the alignment in (d), means for performing a least squares fit analysis to check the alignment.

11. The system of claim 9 wherein the correction areas correspond to chip boundaries, field boundaries, cluster boundaries, subfield boundaries and/or stripe boundaries.

12. The system of claim 9 wherein the correction areas correspond to lithographic exposure fields.

13. The system of claim 9 further comprising:

(j) means for storing the statistical distribution of the mask offset data minus the pre-distortion;

(k) means for obtaining the required statistical distribution specification of the final mask;

(l) means for comparing the statistical distribution of the mask offset data minus the pre-distortion to the required statistical distribution specification of the final mask; and (m) means for providing for disposition of the mask as accept or reject dependent upon the results of the comparison.

14. The system of claim 9 wherein (c) is performed by means for looking at the mask offset of a pair of alignment marks to compute a translation and rotation term which is then applied to the bulk of the data.

* * * * *